United States Patent
Tsou

(10) Patent No.: US 8,963,631 B2
(45) Date of Patent: Feb. 24, 2015

(54) SIGNAL AMPLIFYING CIRCUIT OF COMMUNICATION DEVICE

(71) Applicant: Realtek Semiconductor Corp., Hsinchu (TW)

(72) Inventor: Shan-Chih Tsou, Hsinchu (TW)

(73) Assignee: Realtek Semiconductor Inc., Hsinchu (TW)

(*) Notice: Subject to any disclaimer, the term of this patent is extended or adjusted under 35 U.S.C. 154(b) by 100 days.

(21) Appl. No.: 13/770,488

(22) Filed: Feb. 19, 2013

(65) Prior Publication Data
US 2013/0214864 A1  Aug. 22, 2013

(30) Foreign Application Priority Data
Feb. 21, 2012  (TW) .............................. 101105570 A

(51) Int. Cl.
*H03F 1/02* (2006.01)
*H03F 3/45* (2006.01)

(52) U.S. Cl.
CPC ........ *H03F 3/45071* (2013.01); *H03F 3/45475* (2013.01); *H03F 2203/45526* (2013.01); *H03F 2203/45611* (2013.01); *H03F 2203/45616* (2013.01); *H03F 2203/45618* (2013.01)
USPC ................................................. 330/9

(58) Field of Classification Search
CPC ........................................................ H03F 1/02
USPC ............................................ 330/9, 69; 327/124
See application file for complete search history.

(56) References Cited

U.S. PATENT DOCUMENTS 7,154,308 B2 * 12/2006 Ho ................................ 327/108

* cited by examiner

*Primary Examiner* — Steven J Mottola
(74) *Attorney, Agent, or Firm* — Birch, Stewart, Kolasch & Birch, LLP

(57) ABSTRACT

A signal amplifying circuit of a communication device is disclosed including: an amplifier comprising a first input terminal, a second input terminal, and an output terminal, wherein the input terminal is coupled with a fixed voltage level; a feedback circuit coupled with the second input terminal and the output terminal of the amplifier; a digital-to-analog converter (DAC); a signal processing circuit; a switch for selectively coupling the second input terminal of the amplifier with the DAC or the signal processing circuit; and a control unit coupled with the switch for controlling the operations of the switch.

9 Claims, 2 Drawing Sheets

SIGNAL AMPLIFYING CIRCUIT OF COMMUNICATION DEVICE

CROSS-REFERENCE TO RELATED APPLICATIONS

This application claims the benefit of priority to Patent Application No. 101105570, filed in Taiwan on Feb. 21, 2012; the entirety of which is incorporated herein by reference for all purposes.

BACKGROUND

The disclosure generally relates to a communication device and, more particularly, to a signal amplifying circuit for the communication device.

Nowadays, the design trend of many electronic devices is toward reducing the area or volume of the wireless communication device of the electronic device in order to fit the design requirements of devices miniaturization.

One of conventional approaches for reducing the circuit area or volume is to downsize functionalities of the circuit by discarding partial elements or functional blocks of the communication device to meet the purpose of reducing the circuit area or volume. However, discarding functional blocks of the circuit must reduce the functionalities of the communication device and may also restrict the performance or applications of the circuit. Apparently, this is not an ideal solution.

SUMMARY

In view of the foregoing, it can be appreciated that a substantial need exists for apparatuses that can effectively reduce the circuit area or volume of the communication device without affecting the functionality and performance of the communication device.

An example embodiment of a signal amplifying circuit for a communication device is disclosed comprising: an amplifier, comprising a first input terminal, a second input terminal, and an output terminal, wherein the first input terminal is coupled with a fixed-voltage terminal; a feedback circuit, coupled with the second input terminal and the output terminal of the amplifier; a digital-to-analog converter (DAC); a signal processing circuit; a switch, configured to selectively couple the second input terminal of the amplifier with the digital-to-analog converter or the signal processing circuit; and a control unit coupled with the switch and configured to operably control operations of the switch.

Another example embodiment of a signal amplifying circuit for a communication device is disclosed comprising: a differential amplifier, comprising a first input terminal, a second input terminal, a first output terminal, and a second output terminal, wherein the first output terminal and the second output terminal output a pair of differential signals; a first feedback circuit, coupled with the first input terminal and the second output terminal of the differential amplifier; a second feedback circuit, coupled with the second input terminal and the first output terminal of the differential amplifier; a digital-to-analog converter; a signal processing circuit; a first switch, configured to selectively couple the first input terminal of the differential amplifier with a first output terminal of the digital-to-analog converter or a first output terminal of the signal processing circuit; a second switch configured to selectively couple the second input terminal of the differential amplifier with a second output terminal of the digital-to-analog converter or a second output terminal of the signal processing circuit; and a control unit coupled with the first switch and the second switch and configured to operably control operations of the first switch and the second switch.

It is to be understood that both the foregoing general description and the following detailed description are example and explanatory only and are not restrictive of the invention, as claimed.

DETAILED DESCRIPTION

Figure 1:
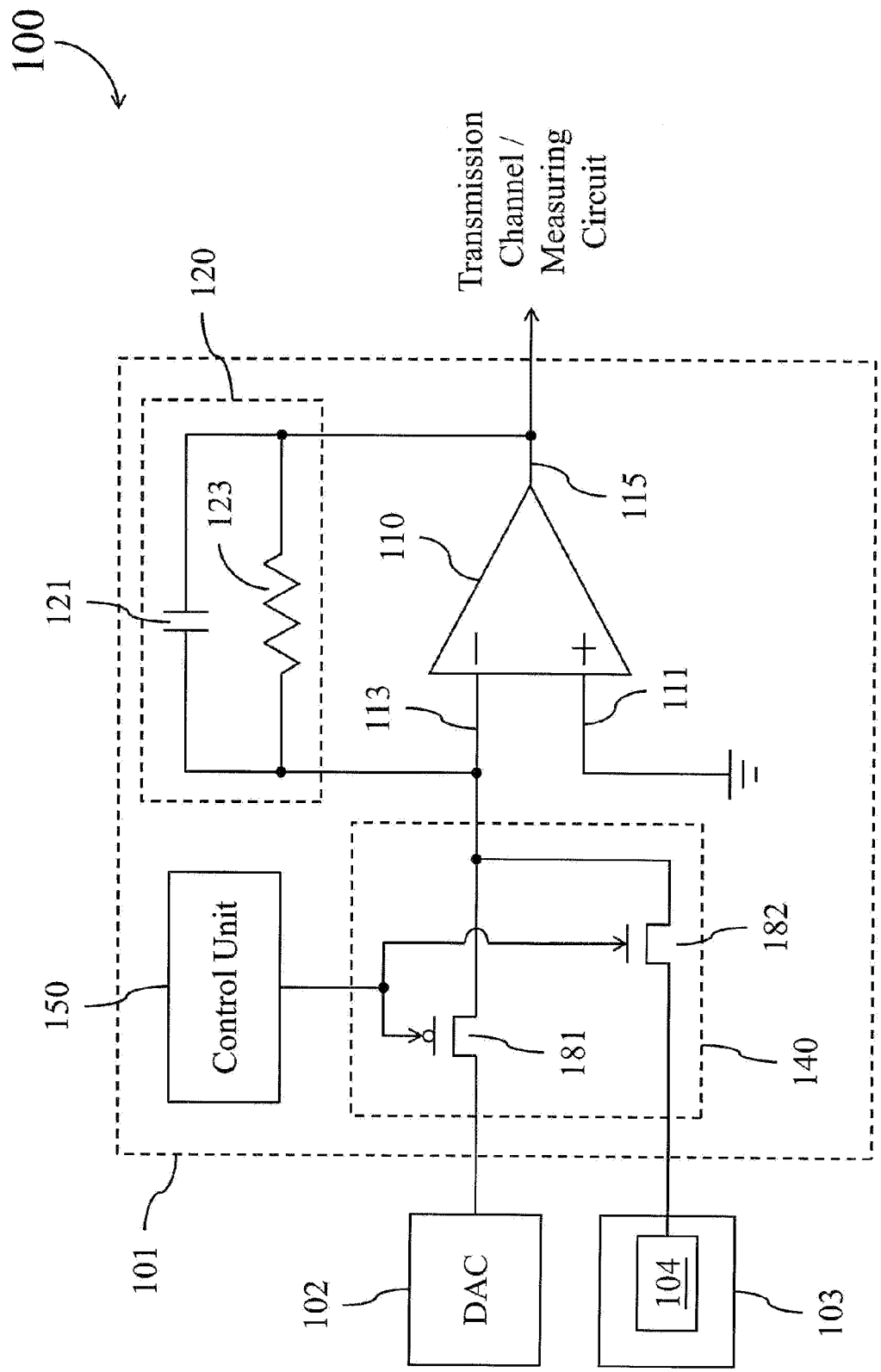
FIG. 1 shows a simplified functional block diagram of a communication device according to an embodiment of the present disclosure.

Reference is made in detail to embodiments of the invention, which are illustrated in the accompanying drawings.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

The same reference numbers may be used throughout the drawings to refer to the same or like parts, components, or operations. Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to . . . " Also, the phrase "coupled with" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a", "an", and "the" herein are intended to comprise the plural forms as well, unless the context clearly indicates otherwise.

FIG. 1 shows a simplified functional block diagram of a communication device 100 according to an embodiment of the present disclosure. The communication device 100 comprises a signal amplifying circuit 101, a digital-to-analog converter (DAC) 102, and a signal processing circuit 103. The signal amplifying circuit 101 is coupled with the DAC 102 and the signal processing circuit 103. The signal amplifying circuit 101 comprises an amplifier 110, a feedback circuit 120, a switch 140, and a control unit 150. In this embodiment, the amplifier 110 is a single-ended amplifier and comprises an input terminal 111, an input terminal 113, and an output terminal 115. In operations, the input terminal 111 of the amplifier 110 is coupled with a fixed-voltage terminal, such as a grounded terminal. The feedback circuit 120 in this embodiment comprises a capacitor 121 and a resistor 123, and both the capacitor 121 and the resistor 123 are coupled between the input terminal 113 and the output terminal 115 of the amplifier 110. The output terminal 115 of the amplifier 110 may be coupled with a transmission channel or a measuring circuit.

In this embodiment, the switch 140 is coupled with the DAC 102, the signal processing circuit 103, and the input terminal 113 of the amplifier 110, and is configured to operably switch the input signal source of the amplifier 110. In implementations, the switch 140 may be coupled with an output terminal of the signal processing circuit 103 or a memory unit 104 of the signal processing circuit 103. The control unit 150 is coupled with the switch 140 and configured to operably generate or set one or more control signals to control operations of the switch 140.

The DAC 102 may convert internal digital signals of the communication device 100 to analog signals for transmission or other signal processing purposes. The signal processing circuit 103 may be other internal circuits in the communication device 100, such as an analog signal processing circuit, an equalizer, an analog front end circuit, a demodulator, an echo cancellation circuit, or a sample-and-hold circuit.

The switch 140 selectively couples the input terminal 113 of the amplifier 110 with the DAC 102 or the signal processing circuit 103 according to the control signals of the control unit 150, so that the input terminal 113 of the amplifier 110 is only coupled with one of the DAC 102 and the signal processing circuit 103 at the same time.

When the control unit 150 configures the switch 140 to couple the input terminal 113 of the amplifier 110 with the DAC 102, and the output terminal 115 of the amplifier 110 is coupled with the transmission channel, the signal amplifying circuit 101 amplifies a transmission signal generated by the DAC 102, and the amplified signal is outputted to the transmission channel through the output terminal 115. In this situation, the role of the signal amplifying circuit 101 is equivalent to a transmission driver circuit of the DAC 102. The transmission signal processed by the signal amplifying circuit 101 has stronger load drive capability, and thus signal distortion can be reduced when transmitting the transmission signal to subsequent stage circuit When the control unit 150 configures the switch 140 to couple the input terminal 113 of the amplifier 110 with the signal processing circuit 103, and the output terminal 115 of the amplifier 110 is coupled with the measuring circuit, the signal amplifying circuit 101 amplifies operational parameters or information of circuit operations transmitted from the signal processing circuit 103, and the amplified signal is outputted to the measuring circuit through the output terminal 115. In this situation, the role of the signal amplifying circuit 101 is equivalent to an I/O pad buffer of the communication device 100, so that a circuit engineer or testing personnel may couple the measuring circuit with the output terminal 115 of the amplifier 110 so as to measure the operational parameters of the signal processing circuit 103 or information of circuit operations or circuit parameters stored in the memory unit 104 of the signal processing circuit 103 through the output terminal 115 of the amplifier 110. With the driving of the signal amplifying circuit 101, the operational parameters or the information of circuit operations transmitted from the signal processing circuit 103 can be successfully transmitted to a circuit pad connected with the output terminal 115 of the amplifier 110, thereby preventing the operational parameters or information of circuit operations to be measured from distortion due to influence of the load effect.

In implementations, the switch 140 may be realized with a combination of appropriate transistors. For example, the switch 140 may be realized by coupling a PFET 181 between the DAC 102 and the input terminal 113 of the amplifier 110 and coupling a NFET 182 between the signal processing circuit 103 and the input terminal 113 of the amplifier 110. When the control unit 150 sets the control signal to a high potential, the control signal turns on the NFET 182 and turns off the PFET 181, and thus causes the input terminal 113 of the amplifier 110 to be coupled with the signal processing circuit 103. When the control unit 150 sets the control signal to a low potential, the control signal turns on the PFET 181 and turns off the NFET 182, and thus causes the input terminal 113 of the amplifier 110 to be coupled with the DAC 102. In implementations, the switch 140 may be realized with other approaches depending on the types of the control signal or requirements of the practical circuits.

Additionally, the previous feedback circuit 120 coupled with the amplifier 110 may be realized with different circuit structures or elements, so that the signal amplifying circuit 101 can be employed in different applications.

Figure 2:
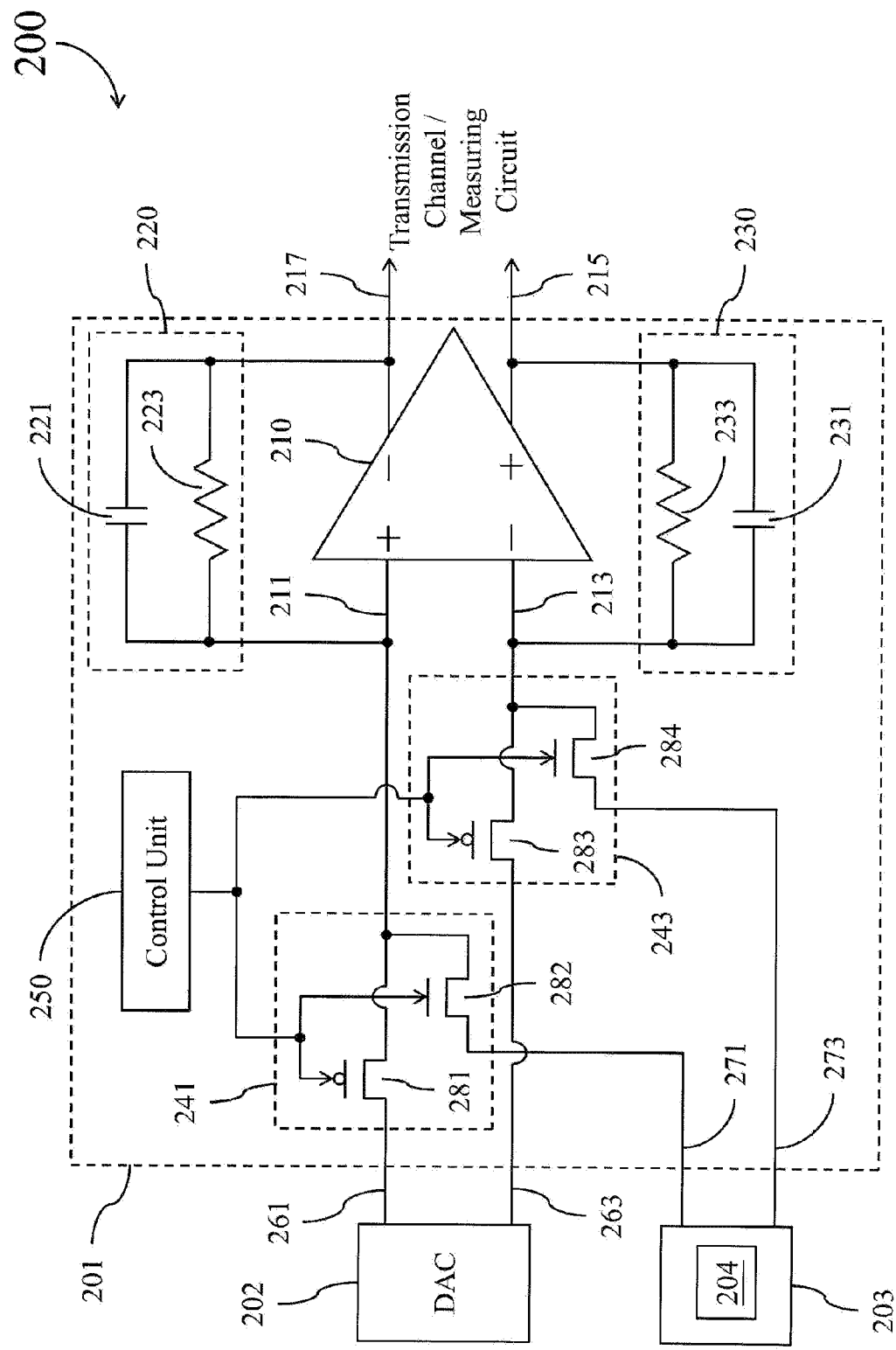
FIG. 2 shows a simplified functional block diagram of a communication device according to another embodiment of the present disclosure.

FIG. 2 shows a simplified functional block diagram of a communication device 200 according to another embodiment of the present disclosure. The communication device 200 comprises a signal amplifying circuit 201, a digital-to-analog converter (DAC) 202, and a signal processing circuit 203. The signal amplifying circuit 201 is coupled with the DAC 202 and the signal processing circuit 203. The signal amplifying circuit 201 comprises an amplifier 210, feedback circuits 220 and 230, switches 241 and 243, and a control unit 250. In this embodiment, the amplifier 210 is a differential amplifier and comprises an input terminal 211, an input terminal 213, and differential output terminals 215 and 217. The feedback circuit 220 in this embodiment comprises a capacitor 221 and a resistor 223, and the feedback circuit 230 comprises a capacitor 231 and a resistor 233. Both the capacitor 221 and the resistor 223 are coupled between the input terminal 211 and the output terminal 217 of the amplifier 210, and the capacitor 231 and the resistor 233 are coupled between the input terminal 213 and the output terminal 215 of the amplifier 210. The differential output terminals 215 and 217 of the amplifier 210 may be coupled with a transmission channel or a measuring circuit.

In this embodiment, the switch 241 is coupled with an output terminal of the DAC 202, an output terminal of the signal processing circuit 203, and the input terminal 211 of the amplifier 210, and is configured to operably switch the signal source of a non-inverting input terminal of the amplifier 210. The switch 243 is coupled with another output terminal of the DAC 202, another output terminal of the signal processing circuit 203, and the input terminal 213 of the amplifier 210, and is configured to operably switch the signal source of an inverting input terminal of the amplifier 210. The control unit 250 is coupled with the switches 241 and 243 and configured to operably generate or set one or more control signals to control operations of the switches 241 and 243.

The DAC 202 comprises differential output terminals 261 and 263. The DAC 202 may convert internal digital signals of the communication device 200 to a pair of differential analog signals for transmission or other signal processing purposes. The signal processing circuit 203 comprises differential output terminals 271 and 273. The signal processing circuit 203 may be other internal circuits in the communication device 200, such as an analog signal processing circuit, an equalizer, an analog front end circuit, a demodulator, an echo cancellation circuit, or a sample-and-hold circuit.

The switch 241 selectively couples the input terminal 211 of the amplifier 210 with the output terminal 261 of the DAC 202 or the output terminal 271 of the signal processing circuit 203 according to the control signals of the control unit 250, so that the input terminal 211 of the amplifier 210 is only coupled with one of the DAC 202 and the signal processing circuit 203 at the same time. The switch 243 selectively couples the input terminal 213 of the amplifier 210 with the output terminal 263 of the DAC 202 or the output terminal 273 of the signal processing circuit 203 according to the control signals of the control unit 250, so that the input terminal 213 of the amplifier 210 is only coupled with one of the DAC 202 and the signal processing circuit 203 at the same time. In implementations, the control unit 250 may utilize a single control signal to synchronously switch the switch 241 and the switch 243. For example, as shown in FIG. 2, the switch 241 may comprise a first transistor 281 and a second transistor 282, and the switch 243 may comprise a third transistor 283 and a fourth transistor 284. The first transistor 281 is coupled with the input terminal 211 of the amplifier 210 and the output terminal 261 of the DAC 202. The second transistor 282 is coupled with the input terminal 211 of the amplifier 210 and the output terminal 271 of the signal processing circuit 203. The third transistor 283 is coupled with the input terminal 213 of the amplifier 210 and the output terminal 263 of the DAC 202. The fourth transistor 284 is coupled with the input terminal 213 of the amplifier 210 and the output terminal 273 of the signal processing circuit 203. When the control unit 250 turns on one of the first transistor 281 and the second transistor 282, the control unit 250 turns off the other transistor in the switch 241. When the control unit 250 turns on the third transistor 283, the control unit 250 turns on the first transistor 281 and turns off the fourth transistor 284, and when the control unit 250 turns on the fourth transistor 284, the control unit 250 turns on the second transistor 282 and turns off the third transistor 283.

When the control unit 250 configures the switch 241 to couple the input terminal 211 of the amplifier 210 with the output terminal 261 of the DAC 202, and configures the switch 243 to couple the input terminal 213 of the amplifier 210 with the output terminal 263 of the DAC 202, and the differential output terminals 215 and 217 of the amplifier 210 are coupled with the transmission channel, the signal amplifying circuit 201 amplifies the differential transmission signals generated by the DAC 102, and the amplified signals are outputted to the transmission channel through the differential output terminals 215 and 217. In this situation, the role of the signal amplifying circuit 201 is equivalent to a transmission driver circuit of the DAC 202. The transmission signal processed by the signal amplifying circuit 201 has stronger load drive capability and noise immunity, thereby greatly improving the quality of signal transmission.

When the control unit 250 configures the switch 241 to couple the input terminal 211 of the amplifier 210 with the output terminal 271 of the signal processing circuit 203, and configures the switch 243 to couple the input terminal 213 of the amplifier 210 with the output terminal 273 of the signal processing circuit 203, and the differential output terminals 215 and 217 of the amplifier 210 are coupled with the measuring circuit, the signal amplifying circuit 201 amplifies operational parameters or information of circuit operations transmitted from the signal processing circuit 203, and the amplified signals are outputted to the measuring circuit through the differential output terminals 215 and 217. In this situation, the role of the signal amplifying circuit 201 is equivalent to an I/O pad buffer of the communication device 200, so that a circuit engineer or testing personnel may couple the measuring circuit with the differential output terminals 215 and 217 of the amplifier 210 so as to measure the operational parameters of the signal processing circuit 203 or information of circuit operations or circuit parameters stored in the memory unit 204 of the signal processing circuit 203 through the differential output terminals 215 and 217. With the driving of the signal amplifying circuit 201, the operational parameters or the information of circuit operations transmitted from the signal processing circuit 203 can be successfully transmitted to a circuit pad connected with the output terminals 215 and 217 of the amplifier 210, thereby preventing the operational parameters or information of circuit operations to be measured from distortion due to the influence of the load effect.

In addition, the previous feedback circuits 220 and 230 coupled with the amplifier 210 may be realized with different circuit structures and elements, so that the signal amplifying circuit 201 can be employed in different applications.

As can be appreciated from the foregoing descriptions that the signal amplifying circuit 101 or 201 is allowed to play the roles of transmission driver circuit or I/O pad buffer at different time points by switching the switch 140 or the switches 241 and 243. Therefore, it only needs to employ a single signal amplifying circuit 101 or 201 in the communication device 100 or 200 to realize two different circuit functionalities, thereby greatly reducing required circuit area or volume without affecting the functionalities and performance of the communication device 100 or 200.

Additionally, the previous approach of downsizing the internal circuit of the communication device 100 or 200 can also effectively reduce power consumption of the communication device 100 or 200.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A signal amplifying circuit of a communication device, comprising:
   an amplifier, comprising a first input terminal, a second input terminal, and an output terminal, wherein the first input terminal is coupled with a fixed-voltage terminal;
   a feedback circuit, coupled with the second input terminal and the output terminal of the amplifier;
   a digital-to-analog converter (DAC);
   a signal processing circuit;
   a switch, configured to selectively couple the second input terminal of the amplifier with the digital-to-analog converter or the signal processing circuit; and
   a control unit coupled with the switch and configured to control the operation of the switch,
   wherein the output terminal of the amplifier is utilized for coupling with a transmission channel or a measuring circuit and for outputting a transmission signal to the transmission channel when the switch couples the second input terminal of the amplifier with the digital-to-analog converter and the output terminal of the amplifier is coupled with the transmission channel, and the measuring circuit is allowed to measure at least one parameter of the signal processing circuit through the output terminal of the amplifier when the switch couples the second input terminal of the amplifier with the signal processing circuit and the output terminal of the amplifier is coupled with the measuring circuit.

2. The signal amplifying circuit of claim 1, wherein the switch comprises:
   a first transistor, coupled with the second input terminal of the amplifier and the digital-to-analog converter; and
   a second transistor, coupled with the second input terminal of the amplifier and the signal processing circuit;

wherein when the control unit turns on one of the first transistor and the second transistor, the control unit turns off the other transistor.

3. The signal amplifying circuit of claim 2, wherein the switch is coupled with a memory unit of the signal processing circuit.

4. The signal amplifying circuit of claim 2, wherein the signal processing circuit is an analog signal processing circuit, an equalizer, an analog front end circuit, a demodulator, an echo cancellation circuit, or a sample-and-hold circuit in the communication device.

5. A signal amplifying circuit of a communication device, comprising:
   a differential amplifier, comprising a first input terminal, a second input terminal, a first output terminal, and a second output terminal, wherein the first output terminal and the second output terminal output a pair of differential signals;
   a first feedback circuit, coupled with the first input terminal and the second output terminal of the differential amplifier;
   a second feedback circuit, coupled with the second input terminal and the first output terminal of the differential amplifier;
   a digital-to-analog converter;
   a signal processing circuit;
   a first switch, configured to selectively couple the first input terminal of the differential amplifier with a first output terminal of the digital-to-analog converter or a first output terminal of the signal processing circuit;
   a second switch, configured to selectively couple the second input terminal of the differential amplifier with a second output terminal of the digital-to-analog converter or a second output terminal of the signal processing circuit; and
   a control unit coupled with the first switch and the second switch and configured to control the operation of the first switch and the second switch.

6. The signal amplifying circuit of claim 5, wherein the first and the second output terminals of the differential amplifier output a transmission signal to a transmission channel when the first switch couples the first input terminal of the differential amplifier with the first output terminal of the digital-to-analog converter, the second switch couples the second input terminal of the differential amplifier with the second output terminal of the digital-to-analog converter, and the first output terminal and the second output terminal of the differential amplifier are coupled with the transmission channel, and a measuring circuit is allowed to measure at least one parameter of the signal processing circuit through the first output terminal and the second output terminal of the differential amplifier when the first switch couples the first input terminal of the differential amplifier with the first output terminal of the signal processing circuit, the second switch couples the second input terminal of the differential amplifier with the second output terminal of the signal processing circuit, and the first output terminal and the second output terminal of the differential amplifier are coupled with the measuring circuit.

7. The signal amplifying circuit of claim 6, wherein the first switch comprises:
   a first transistor, coupled with the first input terminal of the differential amplifier and the first output terminal of the digital-to-analog converter; and
   a second transistor, coupled with the first input terminal of the differential amplifier and the first output terminal of the signal processing circuit;
   wherein when the control unit turns on one of the first transistor and the second transistor, the control unit turns off the other transistor.

8. The signal amplifying circuit of claim 7, wherein the second switch comprises:
   a third transistor, coupled with the second input terminal of the differential amplifier and the second output terminal of the digital-to-analog converter; and
   a fourth transistor, coupled with the second input terminal of the differential amplifier and the second output terminal of the signal processing circuit;
   wherein when the control unit turns on the third transistor, the control unit turns on the first transistor and turns off the fourth transistor, and when the control unit turns on the fourth transistor, the control unit turns on the second transistor and turns off the third transistor.

9. The signal amplifying circuit of claim 8, wherein the signal processing circuit is an analog signal processing circuit, an equalizer, an analog front end circuit, a demodulator, an echo cancellation circuit, or a sample-and-hold circuit in the communication device.

* * * * *